United States Patent
Garcia de Alba Garcin

(10) Patent No.: US 9,431,998 B2
(45) Date of Patent: Aug. 30, 2016

(54) FAST RESPONSE HIGH-ORDER LOW-PASS FILTER

(71) Applicant: Continental Automotive Systems, Inc., Auburn Hills, MI (US)

(72) Inventor: Sergio Garcia de Alba Garcin, Guadalajara (MX)

(73) Assignee: Continental Automotive Systems, Inc., Auburn Hills, MI (US)

( * ) Notice: Subject to any disclaimer, the term of this patent is extended or adjusted under 35 U.S.C. 154(b) by 242 days.

(21) Appl. No.: 14/017,464

(22) Filed: Sep. 4, 2013

(65) Prior Publication Data
US 2014/0167883 A1 Jun. 19, 2014

Related U.S. Application Data

(60) Provisional application No. 61/737,862, filed on Dec. 17, 2012.

(51) Int. Cl.
*H03H 11/12* (2006.01)
*H03H 7/06* (2006.01)
*H03H 7/01* (2006.01)

(52) U.S. Cl.
CPC ........ *H03H 11/1213* (2013.01); *H03H 7/0153* (2013.01); *H03H 7/06* (2013.01); *H03H 11/1204* (2013.01)

(58) Field of Classification Search
CPC ............. H03H 11/12; H03H 11/1213; H03H 11/1204; H03H 7/0153; H03H 7/06
USPC .......................... 333/168, 172, 17.1; 327/555
See application file for complete search history.

(56) References Cited

U.S. PATENT DOCUMENTS

| | | | |
|---|---|---|---|
| 2,763,840 A * | 9/1956 | Pfleger | 333/17.1 |
| 4,749,951 A | 6/1988 | Tanaka | |
| 5,760,662 A * | 6/1998 | Kalb et al. | 333/172 |
| 7,212,960 B2 * | 5/2007 | Quint et al. | 703/14 |
| 7,592,864 B2 | 9/2009 | Kang et al. | |
| 2005/0275488 A1 * | 12/2005 | Blair et al. | 333/202 |
| 2008/0030263 A1 * | 2/2008 | Frederick | H02J 1/10 327/541 |
| 2009/0174977 A1 * | 7/2009 | Zhu | H02H 7/1252 361/79 |

OTHER PUBLICATIONS

Application Note 3203, Lowpass Filter has Improved Step Response, www.maximintegrated.com, Maxim Intergrated, Jun. 22, 2004.
Application Note 3203, Lowpass Filter has Improved Step Response, www.maximintegrated.com, Maxim Intergrated, 2015.

* cited by examiner

*Primary Examiner* — Robert Pascal
*Assistant Examiner* — Rakesh Patel

(57) ABSTRACT

A fast-response high-order low-pass filter circuit is provided. The circuit includes a plurality of low pass filter (LPF) poles that are connected in series, a forward bypass channel that includes a first delta voltage module that conducts at a first predetermined voltage and a first impedance module that provides a first impedance and is in series with the first delta voltage module, and a reverse bypass channel that includes a second delta voltage module that conducts at a second predetermined voltage and a second impedance module that provides a second impedance and is in series with the second delta voltage module. The forward and reverse bypass channels are arranged to bypass current around at least one of the plurality of LPF poles when a voltage difference across the at least one of the plurality of LPF poles exceeds one of the first predetermined voltage and the second predetermined voltage.

14 Claims, 4 Drawing Sheets

FAST RESPONSE HIGH-ORDER LOW-PASS FILTER

PRIORITY

This application claims priority to U.S. Provisional Application No. 61/737,862 filed Dec. 17, 2013, which is hereby included by reference.

FIELD

The present disclosure generally relates to signal filters in electrical circuits and more particularly to multiple-stage filters that include a bypass circuit for selectively routing a signal through less than all of the multiple stages.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

A typical modern vehicle can employ a variable reluctance (VR) sensor to measure speed and/or position of a rotating shaft. Typical applications include a crankshaft position sensor, a transmission speed sensor, a wheel speed sensor, and the like. The VR sensor generates a sinusoidal voltage that increases in frequency and voltage as its associated shaft increases speed. A wave shaping circuit converts the sinusoidal signal to a square wave signal that is compatible with digital electronics such as a microcontroller.

A typical wave shaping circuit includes hysteresis to prevent its output from oscillating when the VR signal voltage changes relatively slowly, e.g. when the VR sensor is measuring a shaft that is rotating slowly. Since the magnitude of the VR signal voltage changes as a function of the shaft speed, it can be necessary to correspondingly change the hysteresis voltage.

Referring now to FIG. 1, a block diagram is shown of a VR sensor circuit in accordance with the prior art. A VR sensor 10 generates a sinusoidal output signal based on the speed of a rotating shaft 12. A VR sensor interface module 14 converts the sinusoidal signal to a digital signal that is compatible with a microcontroller 16. An example of VR sensor interface module 14 includes the MAX9924 device that is manufactured by MAXIM Integrated Products, Inc. Microcontroller 16 estimates the speed of rotating shaft 12 based on the digital signal. Microcontroller 16 also generates a pulse width modulation (PWM) signal 18 based on the shaft speed. The duty cycle of the PWM signal represents a desired hysteresis voltage that VR sensor interface module 14 should use while converting the sinusoidal signal. A low pass filter module 20 generates a bias signal 22 based on PWM signal 18. Bias signal 22 is applied to VR sensor interface module 14 to control its hysteresis voltage. A shortcoming with this design is that low pass filter module 20 limits how fast bias signal 22 can be changed. This can be a problem when rotating shaft 12 quickly changes speed and bias signal 22 materially lags the change, such as lags enough that noise enters the system and microcontroller 16 misinterprets the shaft speed.

SUMMARY

A fast-response high-order low-pass filter circuit is provided. The circuit includes a plurality of low pass filter (LPF) poles that are connected in series, a forward bypass channel that includes a first delta voltage module that conducts at a first predetermined voltage and a first impedance module that provides a first impedance and is in series with the first delta voltage module, and a reverse bypass channel that includes a second delta voltage module that conducts at a second predetermined voltage and a second impedance module that provides a second impedance and is in series with the second delta voltage module. The forward and reverse bypass channels are arranged to bypass current around at least one of the plurality of LPF poles when a voltage difference across the at least one of the plurality of LPF poles exceeds one of the first predetermined voltage and the second predetermined voltage.

In other embodiments, the magnitudes of the first and second predetermined voltages are equal and/or magnitudes of the first and second impedances are equal. The first impedance module and the second impedance module can comprise a resistor. The plurality of LPF poles can comprise RC filters. The first delta voltage module and the second delta voltage module can comprise respective diodes. The first delta voltage module and the second delta voltage module can include respective transistors.

In other embodiments a fast-response high-order low-pass filter circuit includes a plurality of LPF pole means that are connected in series for low pass filtering an analog signal, forward bypass channel means that include a first delta voltage module for conducting at a first predetermined voltage, a first impedance module for providing a first impedance and is in series with the first delta voltage module, and a reverse bypass channel means that includes a second delta voltage module for conducting at a second predetermined voltage and a second impedance module for providing a second impedance and is in series with the second delta voltage module, wherein the forward and reverse bypass channel means are arranged to bypass current around at least one of the plurality of LPF pole means when a voltage difference across the at least one of the plurality of LPF poles exceeds one of the first predetermined voltage and the second predetermined voltage.

The magnitudes of the first and second predetermined voltages can be equal. The magnitudes of the first and second impedances can be equal. The first impedance module and the second impedance module can comprise respective resistors. The plurality of LPF pole means can comprise RC filters. The first delta voltage module and the second delta voltage module can comprise respective diodes. The first delta voltage module and the second delta voltage module can include respective transistors.

A method of providing a fast-response high-order low-pass filter is provided. The method includes applying an analog signal to a series of LPF poles, bypassing at least one of the LPF poles in a forward direction when a voltage difference across the at least one of the LPF poles reaches a first voltage difference, impeding current that bypasses the at least one of the LPF poles in the forward direction, bypassing at least one of the LPF poles in a reverse direction when a voltage difference across the at least one of the LPF poles reaches a second voltage difference, and impeding current that bypasses the at least one of the LPF poles in the reverse direction.

In other embodiments the magnitudes of the first and second predetermined voltages are equal. The magnitudes of the first and second impedances can be equal. The impeding step can include an electrical resistance. The bypassing steps can comprise passing the currents through respective non-linear semiconductors.

Other embodiments provide a computer readable memory that includes instructions for a processor wherein the instructions implement a fast-response high-order low-pass filter method. The method includes applying an analog signal to a series of LPF poles, bypassing at least one of the LPF poles in a forward direction when a voltage difference across the at least one of the LPF poles reaches a first voltage difference, impeding current that bypasses the at least one of the LPF poles in the forward direction, bypassing at least one of the LPF poles in a reverse direction when a voltage difference across the at least one of the LPF poles reaches a second voltage difference, and impeding current that bypasses the at least one of the LPF poles in the reverse direction.

In other embodiments the magnitudes of the first and second predetermined voltages are equal. The magnitudes of the first and second impedances can be equal. The impeding step can include an electrical resistance. The bypassing steps can comprise passing the currents through respective non-linear semiconductors.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
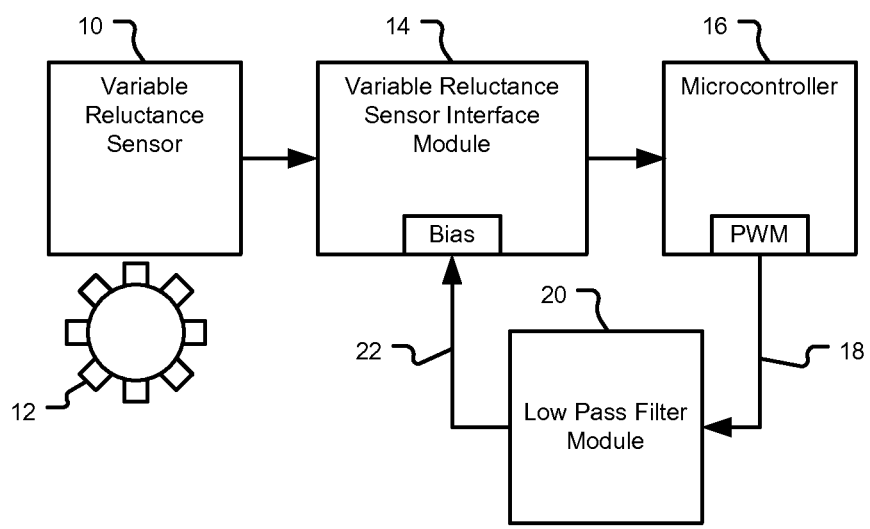
FIG. 1 is a functional block diagram of variable reluctance sensor circuit in accordance with the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2:
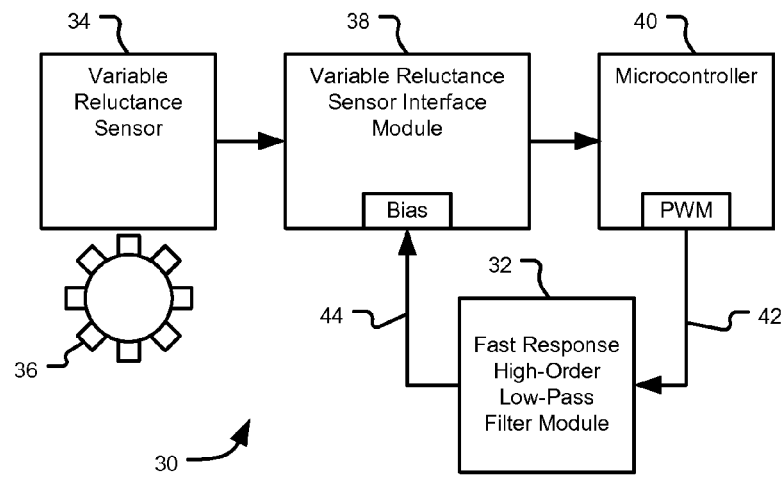
FIG. 2 is a functional block diagram of a variable reluctance sensor circuit with an improved filter module.

Referring now to FIG. 2, a block diagram is shown of a variable reluctance (VR) sensor circuit 30. VR sensor circuit 30 includes a fast response high-order low-pass filter module 32 that improves the operation of VR sensor circuit 30 over the prior art. The design and operation of fast response high-order low-pass filter module 32 is described further below.

A VR sensor 34 generates a sinusoidal output signal based on the speed of a rotating shaft 36. A VR sensor interface module 38 converts the sinusoidal signal to a digital signal that is compatible with a microcontroller 40. An example of VR sensor interface module 40 includes the MAX9924 device that is manufactured by MAXIM Integrated Products, Inc. Microcontroller 40 estimates the speed of rotating shaft 36 based on the digital signal. Microcontroller 40 also generates a pulse width modulation (PWM) signal 42 based on the shaft speed. The duty cycle of PWM signal 42 represents a desired hysteresis voltage that VR sensor interface module 38 should use while converting the sinusoidal signal. Fast response high-order low-pass filter module 32 generates a bias signal 44 based on PWM signal 42. Bias signal 42 is applied to VR sensor interface module 38 to control its hysteresis voltage, which determines its ability to reject noise that is in the sinusoidal signal.

Fast response high-order low-pass filter module 32 improves the performance of VR sensor circuit 30 by quickly changing the magnitude of bias signal 44 while still providing a high-order, low-pass filter function. When compared to the prior art, this improves the response of VR sensor circuit 30 while rotating shaft 12 changes speed.

Figure 3:
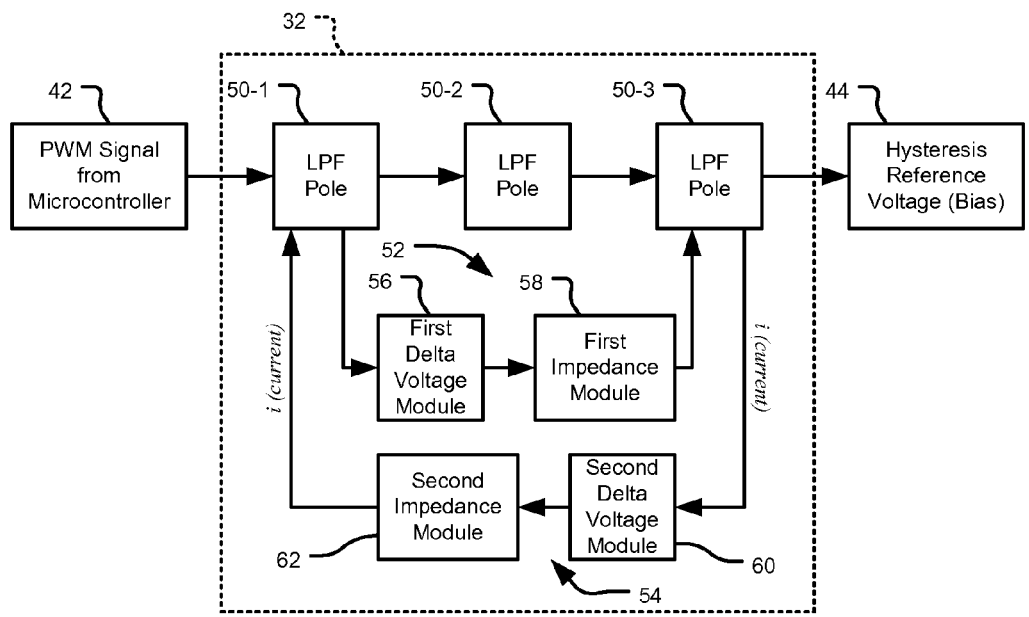
FIG. 3 is a functional block diagram of the improved filter module of FIG. 2.

Referring now to FIG. 3, a block diagram is shown of an embodiment of fast response high-order low-pass filter module 32. A first, a second, and a third low pass filter (LPF) pole 50-1 . . . 50-3, collectively referred to as low pass filter 50, are connected in series and provide a high-order filter that converts PWM signal 42 to bias voltage 44 during steady state operation, i.e. when the shaft speed is relatively constant. It should be appreciated that although low-pass filter 50 is shown with three poles, it can also be designed with any number of poles equal to or greater than two.

A bypass structure includes a forward bypass channel 52 and a reverse bypass channel 54. The bypass structure activates when rotating shaft 36 accelerates or decelerates enough to generate associated predetermined voltages that are described below.

Forward bypass channel 52 includes a first delta voltage module 56 in series with a first impedance module 58. In the depicted embodiment first delta voltage module 56 receives a signal from LPF pole 50-1. First impedance module 54 provides a signal to LPF pole 50-3 based on a signal from first delta voltage module 56.

Reverse bypass channel 54 includes a second delta voltage module 60 in series with a second impedance module 62. In the depicted embodiment second delta voltage module 60 receives a signal from LPF pole 50-3. Second impedance module 54 provides a signal to LPF pole 50-1 based on a signal from second delta voltage module 60.

Forward bypass channel 52 and reverse bypass channel 54 can be implemented between two contiguous LPF poles 50, or with one or more interposing LPF poles 50 such as shown. When the duty cycle of PWM signal 42 increases to generate a higher bias voltage 44, the increase is first reflected at the output of first LPF pole 50-1. This results in an average voltage difference between LPF pole 50-1 and the downstream LPF pole 50-2 that responds later. If this voltage difference is greater than a predetermined voltage of first delta voltage module 56 then a rush of current through it and first impedance module 58 help change bias voltage 44 to a desired bias voltage level faster than in the prior art. A similar effect happens via reverse bypass channels 54 when the duty cycle decreases to reduce bias voltage 44. The result is that fast response high-order low-pass filter module 32 can generate bias voltage 44 with very low ripple, but with faster rise and fall times than the prior art.

For the circuit to operate as described, the DC voltage in steady state between the LPF poles 50 that are connected to the forward and reverse bypass channels 52, 54 must be less than the predetermined voltages of their respective first and second delta voltage modules 56. Therefore attention has to be given to the design of voltage divisors that are parts of the filters as will be shown and described in FIGS. 4-6 below.

Figure 4:
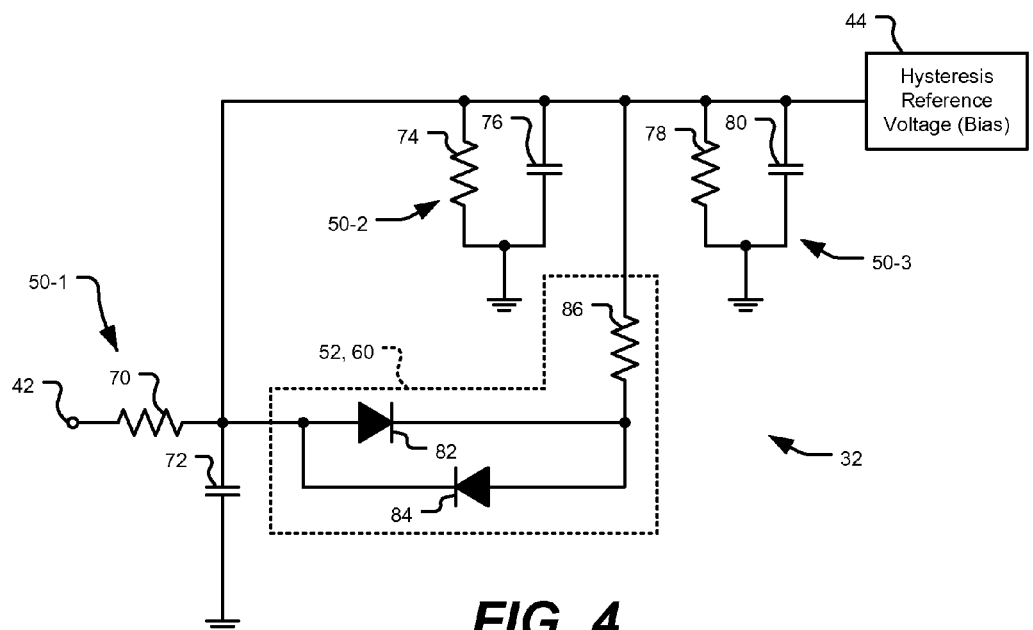
FIG. 4 is a schematic diagram of an embodiment of the improved filter module of FIG. 3.

Referring now to FIG. 4, a schematic diagram is shown of a first embodiment of fast response high-order low-pass filter module 32. A first RC filter implements first LPF pole 50-1 with a resistor 70 and capacitor 72. A second RC filter implements second LPF pole 50-2 with a resistor 74 and a capacitor 76. A third RC filter implements third LPF pole 50-3 with a resistor 78 and a capacitor 80.

Forward bypass channel 52 and reverse bypass channel 54 are implemented with a diode 82, a diode 84, and a resistor 86. The anode of first diode 82 connects to the cathode of second diode 84 and the junction of resistor 70 and capacitor 72. The cathode of first diode 82 connects to the anode of second diode 84 and to one end of resistor 86. The other end of resistor 86 connects to the input of third LPF pole 50-3.

Resistor 86 implements first impedance module 58 while diode 82 is forward biased and implements second impedance module 62 while diode 84 is forward biased. Diode 82 and its associated forward bias voltage implement first delta voltage module 56 and its associated predetermined voltage. Diode 84 and its associated forward bias voltage implement second delta voltage module 60 and its associated predetermined voltage.

Figure 5:
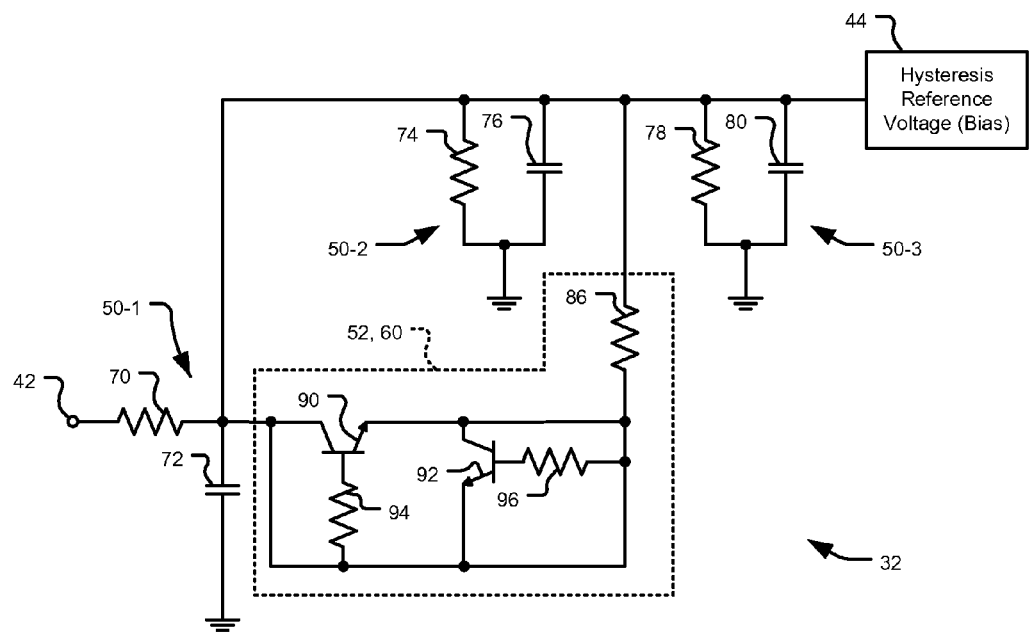
FIG. 5 is a schematic diagram of a first alternate embodiment of the improved filter module.

Referring now to FIG. 5, a schematic diagram is shown of a second embodiment of the fast response high-order low-pass filter module 32. The embodiment is similar to that shown in FIG. 4 with the exception that a transistor 90 replaces diode 82 and a transistor 92 replaces diode 84. Both transistors are arranged as emitter followers and have associated resistors 94 and 96 in series with their bases. Since transistors 90, 92 implement respective ones of first and second delta voltage modules 56, 60, their associated base resistors 94, 96 can be adjusted to provide desired predetermined voltages of first and second delta voltage modules 56, 60.

Figure 6:
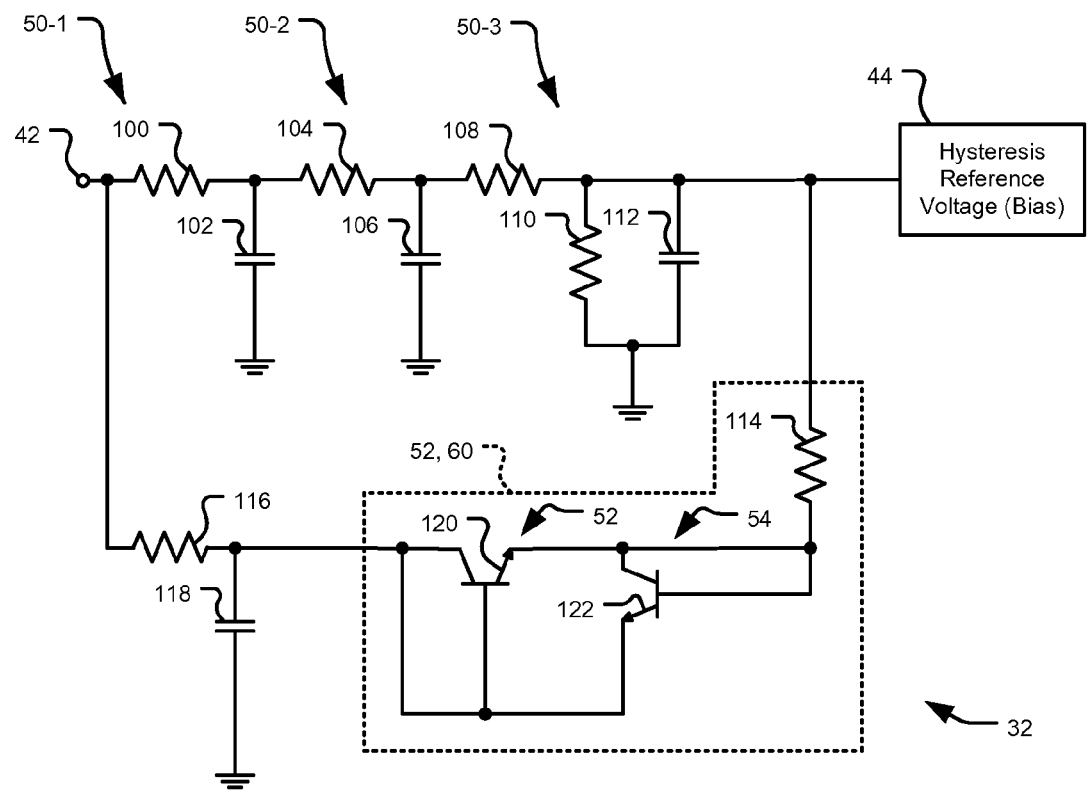
FIG. 6 is a schematic diagram of a second alternate embodiment of the improved filter module.

Referring now to FIG. 6, a schematic diagram is shown of a third embodiment of fast response high-order low-pass filter module 32. First LPF pole 50-1 is implemented in parts. A first part includes an RC filter having a resistor 100 and a capacitor 102. The second part includes an RC filter having a resistor 116 and a capacitor 118. The junction of resistor R116 and capacitor 118 communicates with ends of forward bypass channel 52 and reverse bypass channel 60. The other ends of forward bypass channel 52 and reverse bypass channel 60 communicate with the output side of third LPF pole 50-3.

Second LPF pole 50-2 is implemented with an RC filter having a resistor 104 and a capacitor 106. Third LPF pole 50-3 is implemented with a series-parallel RC filter having a series resistor 108 that feeds into a parallel combination of a resistor 110 and a capacitor 112.

Forward bypass channel 52 and reverse bypass channel 60 are implemented with a transistor 120 and a transistor 122. Both transistors are arranged as emitter followers. Since transistors 120, 122 implement respective ones of first and second delta voltage modules 56, 60, their associated base-emitter junction voltages provide the predetermined voltages of first and second delta voltage modules 56, 60. A resistor 114 implements first impedance module 58 while transistor 120 is conducting and implements second impedance module 62 while transistor 122 is conducting.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A fast-response high-order low-pass filter circuit comprising:
   a plurality of low pass filter (LPF) poles that are connected in series for low pass filtering an analog signal;
   a forward bypass channel that includes a first transistor, a second transistor, and a resistor, which is configured to conduct at a first predetermined voltage and to provide a first impedance; and
   a reverse bypass channel that includes the first transistor, the second transistor, and the resistor, which is configured to conduct at a second predetermined voltage and to provide a second impedance wherein the forward and reverse bypass channels are arranged to bypass current around at least one of the plurality of LPF poles when a voltage difference across the at least one of the plurality of LPF poles exceeds one of the first predetermined voltage and the second predetermined voltage, wherein the magnitudes of the first and second impedances are equal.

2. A fast-response high-order low-pass filter circuit, comprising:
   a plurality of low pass filter poles (LPF) that are connected in series;
   a forward bypass channel that includes a first delta voltage module that conducts at a first predetermined voltage and a first impedance module that provides a first impedance and is in series with the first delta voltage module; and
   a reverse bypass channel that includes a second delta voltage module that conducts at a second predetermined voltage and a second impedance module that provides a second impedance and is in series with the second delta voltage module, wherein the forward and reverse bypass channels are arranged to bypass current around at least one of the plurality of LPF poles when a voltage difference across the at least one of the plurality of LPF poles exceeds one of the first predetermined voltage and the second predetermined voltage, wherein the magnitudes of the first and second predetermined voltages are equal.

3. The fast-response high-order low-pass filter circuit of claim 2 wherein the magnitudes of the first and second impedances are equal.

4. The fast-response high-order low-pass filter circuit of claim 3 wherein the first impedance module and the second impedance module comprise a resistor.

5. The fast-response high-order low-pass filter circuit of claim 2 wherein the plurality of low pass filter (LPF) poles comprise RC filters.

6. A non-transitory computer readable memory that includes instructions for a processor wherein the instructions implement a fast-response high-order low-pass filter method, comprising:

applying an analog signal to a series of low pass filter (LPF) poles;

bypassing at least one LPF pole of the series of LPF poles in a forward direction when a voltage difference across the at least one LPF pole reaches a first voltage difference;

impeding current that bypasses the at least one LPF pole in the forward direction;

bypassing one or more LPF poles of the series of LPF poles in a reverse direction when a voltage difference across the one or more LPF poles reaches a second voltage difference, wherein the magnitudes of the first and second voltage differences are equal; and impeding current that bypasses the one or more LPF poles in the reverse direction.

7. The non-transitory computer readable memory of claim 6 wherein the magnitudes of the first and second impedances are equal.

8. The non-transitory computer readable memory of claim 7 wherein each of the impeding steps comprises bypassing the at least one of the LPF poles through an electrical resistance.

9. A fast-response high-order low-pass filter circuit comprising:
a plurality of low pass filter (LPF) poles that are connected in series for low pass filtering an analog signal;
a forward bypass channel that includes a first transistor, a second transistor, and a resistor, which is configured to conduct at a first predetermined voltage and to provide a first impedance; and
a reverse bypass channel that includes the first transistor, the second transistor, and the resistor, which is configured to conduct at a second predetermined voltage and to provide a second impedance wherein the forward and reverse bypass channels are arranged to bypass current around at least one of the plurality of LPF poles when a voltage difference across the at least one of the plurality of LPF poles exceeds one of the first predetermined voltage and the second predetermined voltage, wherein the magnitudes of the first and second predetermined voltages are equal.

10. The fast-response high-order low-pass filter circuit of claim 9 wherein the plurality of low pass filter (LPF) poles comprise RC filters.

11. A method of providing a fast-response high-order low-pass filter, comprising:
applying an analog signal to a series of low pass filter (LPF) poles;
bypassing at least one LPF pole of the series of LPF poles in a forward direction when a voltage difference across the at least one LPF poles reaches a first voltage difference;
impeding current that bypasses the at least one of the LPF poles in the forward direction;
bypassing one or more LPF poles of the series of LPF poles in a reverse direction when a voltage difference across the one or more LPF poles reaches a second voltage difference; and
impeding current that bypasses the one or more LPF poles in the reverse direction, wherein the magnitudes of the first and second voltage differences are equal.

12. The method of claim 11 wherein each of the bypassing steps comprises passing the currents through respective nonlinear semiconductors.

13. The method of claim 11 wherein the magnitudes of the first and second impedances are equal.

14. The method of claim 13 wherein each of the impeding steps comprises bypassing the at least one of the LPF poles through an electrical resistance.

* * * * *